United States Patent
Kang et al.

(10) Patent No.: US 9,134,750 B2
(45) Date of Patent: Sep. 15, 2015

(54) EMBEDDED MULTIMEDIA CARD (EMMC), EMMC SYSTEM, AND METHODS OF OPERATION

(71) Applicant: SAMSUNG ELECTRONICS CO., LTD., Suwon-Si, Gyeonggi-Do (KR)

(72) Inventors: Young Gyu Kang, Yongin-Si (KR); Sung Ho Seo, Seoul (KR); Myung Sub Shin, Suwon-Si (KR); Kyung Phil Yoo, Seoul (KR); Jung Pil Lee, Hwaseong-Si (KR); Jun Ho Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 63 days.

(21) Appl. No.: 14/026,094

(22) Filed: Sep. 13, 2013

(65) Prior Publication Data

US 2014/0082404 A1 Mar. 20, 2014

(30) Foreign Application Priority Data

Sep. 14, 2012 (KR) ........................ 10-2012-0102475

(51) Int. Cl.
| | | |
|---|---|---|
| G11C 8/00 | (2006.01) | |
| G06F 1/10 | (2006.01) | |
| G11C 13/00 | (2006.01) | |
| G11C 11/56 | (2006.01) | |
| G11C 7/22 | (2006.01) | |
| G11C 29/02 | (2006.01) | |

(52) U.S. Cl.
CPC *G06F 1/10* (2013.01); *G11C 7/222* (2013.01); *G11C 11/5628* (2013.01); *G11C 13/0069* (2013.01); *G11C 29/022* (2013.01); *G11C 29/023* (2013.01); *G11C 29/028* (2013.01)

(58) Field of Classification Search
CPC .......... G06F 3/0659; G06F 2212/7201; G06F 2212/7208; G06F 3/0656; G11C 11/5628; G11C 13/0069; G11C 7/1006
USPC .................. 365/233.1, 154, 189.011, 189.02, 365/189.17, 189.05, 189.12
See application file for complete search history.

(56) References Cited

U.S. PATENT DOCUMENTS

| | | |
|---|---|---|
| 6,691,214 B1 | 2/2004 | Li et al. |
| 6,798,707 B2 | 9/2004 | Niwa et al. |
| 7,036,053 B2 | 4/2006 | Zurnkehr et al. |
| 7,076,678 B2 | 7/2006 | LaBerge |
| 7,679,401 B1 * | 3/2010 | Redgrave ........................ 326/40 |
| 7,739,487 B2 | 6/2010 | Mylly et al. |
| 8,140,778 B1 * | 3/2012 | Hasan et al. .................. 711/154 |
| 2008/0267301 A1 * | 10/2008 | Alfano et al. ................. 375/258 |
| 2012/0098567 A1 * | 4/2012 | Hutchings et al. .............. 326/38 |
| 2013/0044881 A1 * | 2/2013 | Chang ........................... 380/278 |

FOREIGN PATENT DOCUMENTS

| | | |
|---|---|---|
| JP | 08194664 | 7/1996 |
| KR | 0442372 | 5/2004 |

* cited by examiner

*Primary Examiner* — Fernando Hidalgo
(74) *Attorney, Agent, or Firm* — Volentine & Whitt, PLLC

(57) ABSTRACT

An embedded multimedia card (eMMC) communicating with a host includes; a latch circuit that receives and latches a data signal according to either a first edge or a second edge of a clock to thereby generate a latched data signal, and a start bit detector that detects in the latched data signal a start bit and provides a valid data signal from a portion of the latched data signal following the start bit.

17 Claims, 19 Drawing Sheets

FIG. 8

| CMD INDEX | Type | Argument | Resp | Abbreviation | Command Description |
|---|---|---|---|---|---|
| CMDxx | adtc | [31:0] stuff bits | Resp | Get Tuning Block | 128-clock of tuning pattern(64byte in 4bit mode or 128byte in 8bit mode) is sent for DDR400 optimal sampling point detection |

FIG. 9

| Name | Field | Size(Bytes) | Cell Type | CSD-Slice |
|---|---|---|---|---|
| Device Tuning Clock | DEVICE_TUN_CLK | 1 | R/W | [xxx] |

FIG. 10

| Bit | Command Set |
|---|---|
| 7~4 | Reserved |
| 3~0 | 4'b0000 : −800ps<br>4'b0001 : −700ps<br>4'b0010 : −600ps<br>4'b0011 : −500ps<br>4'b0100 : −400ps<br>4'b0101 : −300ps<br>4'b0110 : −200ps<br>4'b0111 : −100ps<br>4'b1000 : 0ps<br>4'b1001 : 100ps<br>4'b1010 : 200ps<br>4'b1011 : 300ps<br>4'b1100 : 400ps<br>4'b1101 : 500ps<br>4'b1110 : 600ps<br>4'b1111 : 700ps |

FIG. 16

| Bit | Device Type |
|---|---|
| 7 | DDR400 Dual Data Rate e·MMC @ 200 MHz – 1.2V I/O |
| 6 | DDR400 Dual Data Rate e·MMC @ 200 MHz – 1.8V I/O |
| 5 | HS200 Single Data Rate e·MMC @ 200 MHz – 1.2V I/O |
| 4 | HS200 Single Data Rate e·MMC @ 200 MHz – 1.8V I/O |
| 3 | High-Speed Dual Data Rate e·MMC @ 52 MHz – 1.2V I/O |
| 2 | High-Speed Dual Data Rate e·MMC @ 52 MHz – 1.8V or 3V I/O |
| 1 | High-Speed e·MMC @ 52 MHz – at rated device voltage(s) |
| 0 | High-Speed e·MMC @ 26 MHz – at rated device voltage(s) |

FIG. 17A

HS_TIMING(timing and driver strength)

| Bit 7 | Bit 6 | Bit 5 | Bit 4 | Bit 3 | Bit 2 | Bit 1 | Bit 0 |
|---|---|---|---|---|---|---|---|
| Selected Driver Strength | | | | Timing Interface | | | |

FIG. 17B

HS_TIMING values

| Value | Timing Interface | Remarks |
|---|---|---|
| 0x0 | Selecting backwards compatibility interface timing | |
| 0x1 | High Speed | |
| 0x2 | HS200 | |
| 0x3 | DDR400 | |

Note1: $t_{ISU}$ and $t_{IH}$ are measured at $V_{IL}$(max.) and $V_{IH}$(min.).
Note2: $V_{IH}$ denote $V_{IH}$(min.) and $V_{IL}$ denotes $V_{IL}$(max.).

FIG. 19

| Parameter | | Symbol | Min | Max. | Unit | Remark |
|---|---|---|---|---|---|---|
| Input CLK | | | | | | |
| Cycle time data transfer mode | | $t_{PERIOD}$ | 5 | — | ns | 200MHz(Max.), between rising edges |
| Clock high time | | $t_{WH}$ | 1.5 | | ns | $C_{BGA} \leq 6pF$ |
| Clock low time | | $t_{WL}$ | 1.5 | | ns | $C_{BGA} \leq 6pF$ |
| Clock rising/falling time | | $t_{TLH}, t_{THL}$ | — | $0.2 \cdot t_{PERIOD}$ | ns | tTLH, tTHL<1ns(max.)at 200MHz, $C_{BGA}$=6pF, The absolute maximum value of tTLH, tTHL is 10ns regardless of clock frequency. |
| Clock duty cycle | | | 47.5 | 52.5 | % | Includes jitter, phase noise |
| Input DAT (referenced to CLK) | | | | | | |
| 333MHz | Input set-up time | tISUddr | 0.5 | | ns | $4pF \leq C_{BGA} \leq 6pF$ |
| | Input hold time | tIHddr | 0.5 | | ns | $4pF \leq C_{BGA} \leq 6pF$ |
| 400MHz | Input set-up time | tISUddr | 0.4 | | ns | $4pF \leq C_{BGA} \leq 6pF$ |
| | Input hold time | tIHddr | 0.4 | | ns | $4pF \leq C_{BGA} \leq 6pF$ |

US 9,134,750 B2

EMBEDDED MULTIMEDIA CARD (EMMC), EMMC SYSTEM, AND METHODS OF OPERATION

CROSS-REFERENCE TO RELATED APPLICATIONS

This application claims priority under 35 U.S.C. §119(a) from Korean Patent Application No. 10-2012-0102475 filed Sep. 14, 2012, the subject matter of which is hereby incorporated by reference.

BACKGROUND

The inventive concept relates to embedded multimedia card (eMMC) systems and methods of operating same. More particularly, the inventive concept relates to eMMC systems that prevent data loss potentially caused by clock signal distortion during data transfer.

The so-called multimedia card (MMC) is a flash memory card standard. The eMMC is an embedded MMC standard defined by the Joint Electron Devices Engineering Council (JEDEC). In general configuration and application eMMCs are designed to be inserted (or "embedded") in conjunction with a host within mobile communication devices such as smart phones. Conventionally, the eMMC communicates data signals, control signals, commands, clock(s) and/or power signals with the connected host in accordance with a standardize ten (10) signal line bus.

Those skilled in the art will understand that various JEDEC standards are available that characterize and/or define the structure, constitution and/or operating parameters of certain eMMC. These standards may be readily obtained and consulted by recourse to http://www.jedec.org. For example, the embedded multimedia card (eMMC) electrical standard, version 4.51 published June 2012 (i.e., JESD84-B451) contains many terms and technical definitions that are useful to an understanding of the inventive concept described hereafter.

The data signals communicated between an eMMC and a host in an eMMC system respectively include a start bit, data bits, a cyclic redundancy check (CRC) bits, and an end bit. So long as eMMC systems and host devices including same operate at relatively low speeds, the detection of a data signal start bit using an impair clock signal is usually not a problem. An impaired clock signal may be one that is distorted, has a low amplitude, or a fluctuating phase, for example. Unfortunately, emerging data processing systems including an eMMC need to process data fast for a short time. Such high-speed operation does not allow enough time to restore an impaired clock signal due to the relatively small size of a valid data window. As a result, it is often difficult to properly detect a data signal start bit using an impaired clock signal, and this may cause a loss of data coherency.

SUMMARY

According to certain embodiments of the inventive concept, there is provided an embedded multimedia card (eMMC) communicating with a host, the eMMC comprising; a latch circuit configured to receive and latch a data signal according to one of a first edge and a second edge of a clock to generate a latched data signal, and a start bit detector configured to detect in the latched data signal a start bit, and provides a valid data signal from a portion of the latched data signal following the start bit.

According to certain embodiments of the inventive concept, there is provided a method of operating an embedded multimedia card (eMMC) system including an eMMC having an extended card specific data (EXT_CSD) register and a host, the method comprising; determining a channel characteristic for a clock channel communicating a clock from the host to the eMMC, modifying eMMC information stored in the EXT_CSD register in accordance with the channel characteristic, communicating a SWITCH command from the host to the eMMC defined in accordance with the modified eMMC information, generating a selection signal in the eMMC in response to the SWITCH command, latching a data signal received from the host at one of a first edge and a second edge of the clock in response to the selection signal to generate a latched data signal, and detecting detect a start bit in the latched data signal.

According to certain embodiments of the inventive concept, there is provided a method of operating an embedded multimedia card (eMMC) system including an eMMC having an extended card specific data (EXT_CSD) register and a host, the method comprising; communicating a clock, a tuning command, and a tuning block data signal from the host to the eMMC, performing a tuning operation in response to the tuning command and the tuning block data signal in the eMMC to identify a valid window by iteratively adjusting the phase of the clock, and communicating eMMC information stored in the EXT_CSD register updated in accordance with the identified valid window from the host to the eMMC.

BRIEF DESCRIPTION OF THE DRAWINGS

FIG. 8 is a table listing a tuning command that may be used in conjunction with the method of FIG. 7;

FIG. 9 is a table listing one example of a device tuning clock field for extended card specific data (EXT_CSD) that may be used in conjunction with the method of FIG. 7;

FIG. 10 is a table listing possible EXT_CSD data with respect to a tuning block data signal according to the method of FIG. 7;

FIG. 16 is a table listing possible bit definitions for a device type field of an eMMC capable of operating in DDR 400 mode;

FIG. 17, inclusive of FIGS. 17A and 17B, illustrates HS_TIMING and HS_TIMING values for an eMMC capable of operating in DDR400 mode;

FIG. 19 is a table listing parameters associated with an eMMC operating in accordance with the timing considerations of FIG. 18.

DETAILED DESCRIPTION

Figure 1:
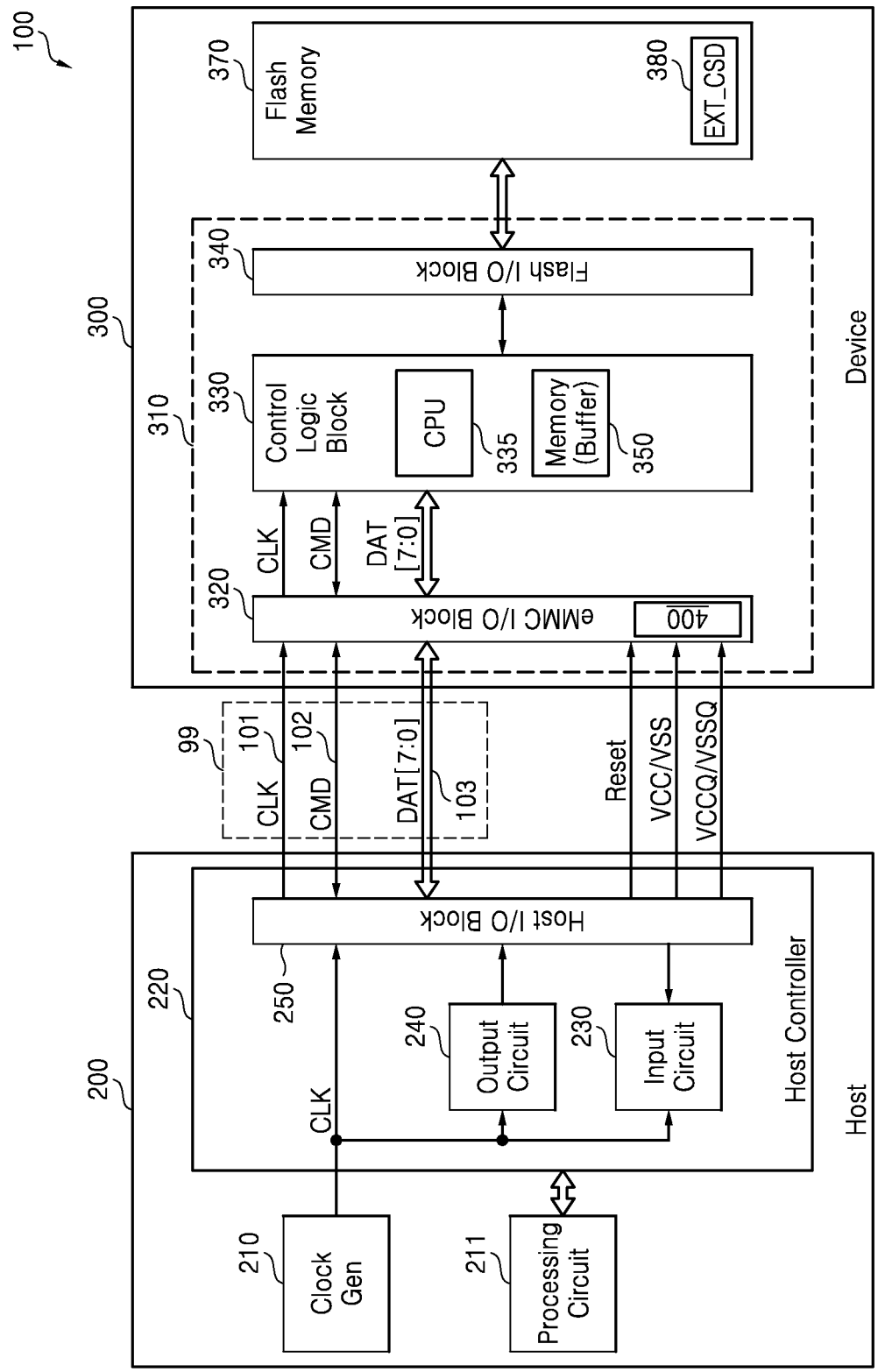
FIG. 1 is a block diagram of an embedded multimedia card (eMMC) system according to embodiments of the inventive concept.

Certain embodiments of the inventive concept now will be described in some additional detail with reference to the accompanying drawings. This invention may, however, be embodied in many different forms and should not be construed as limited to only the illustrated embodiments. Rather, these embodiments are provided so that this disclosure will be thorough and complete, and will fully convey the scope of the invention to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Within various embodiments of the inventive concept, the term "channel" is used to denote a signal path enabling the transmission of one or more electrical signal(s) (e.g., a voltage). As will be understood by those skilled in the art, a channel may include one or more of; circuits acting upon the one or more electrical signal(s), a host pad (and/or pin), an eMMC pad (and/or pin), a line (or collection of lines), a driver—specifically including but not limited to certain differential amplifiers, and a receiver—specifically including but not limited to certain differential amplifiers.

Those skilled in the art will understand the general technical concepts and design options involved in providing a double data rate (DDR) mode of operation—specifically including so-called "DDR 400". Within the context of certain embodiments of the inventive concept certain conventionally understood aspect of DDR 400 will be redefined, and the corresponding structure and operative nature of a host or eMMC supporting such redefinitions will be set forth in some detail.

Here, "DDR400" is a mode of operation in which data is processed at 200 MHz DDR using an input/output (I/O) operating voltage of either 1.2V or 1.8V, as summarized in Table 1 below. With respect eMMC used in certain embodiments of the inventive concept, any operating mode having a maximum data transfer rate equal to or less than 200 MB/s will referred to as a "low-speed mode", while any operating mode having a data transfer rate greater than 200 MB/s will be referred to as a "high-speed mode".

TABLE 1

| Mode name | Data rate | I/O voltage | Frequency | Max data transfer (x8) |
| --- | --- | --- | --- | --- |
| Backward compatibility with legacy MMC | Single | 3/1.8 V/1.2 V | 0-26 MHz | 26 MB/s |
| High speed SDR | Single | 3/1.8 V/1.2 V | 0-52 MHz | 52 MB/s |
| High speed DDR | Dual | 3/1.8 V/1.2 V | 0-52 MHz | 104 MB/s |
| HS200 | Single | 1.8 V/1.2 V | 0-200 MHz | 200 MB/s |
| DDR400 | Dual | 1.8 V/1.2 V | 0-200 MHz | 400 MB/s |

Regardless of specific operating mode, certain embodiments of the inventive concept provide eMMC systems capable of adjusting a detected position for a start bit of a data signal being communicated between an eMMC and host. Using this approach eMMC systems consistent with embodiments of the inventive concept prevent data loss that may be caused by a load component during data transfer.

FIG. 1 is a block diagram of an eMMC system 100 according to embodiments of the inventive concept. The eMMC system 100 generally includes a host 200 and an eMMC device 300.

The host 200 may be used to control the data processing operations (e.g., read/write operations) performed by the eMMC 300. Data processing operations may be performed using a single data rate (SDR) or a double data rate (DDR). Those skilled in the art will understand the general technical concepts and design options involved in providing a DDR mode of operation—specifically including so-called DDR 400. The host 200 may be a microprocessor or an application processor that is embedded or implemented in an electronic device. The electronic device may be (e.g.,) a personal computer (PC), a laptop computer, a mobile telephone, a smart phone, a tablet PC, a personal digital assistant (PDA), an enterprise digital assistant (EDA), a digital still camera, a portable multimedia player (PMP), a personal navigation device or portable navigation device (PND), an MP3 player, a handheld game console, or an e-book.

The host 200 includes a clock generator 210, a processing circuit 211, and a host controller 220. The clock generator 210 may be used to generate a clock signal (CLK) (hereafter, "clock CLK") that is used by the host 200 and/or the eMMC 300 as a reference signal. Thus, the eMMC 300 is routinely provided with the clock CLK by the host 200. The clock generator 210 may be conventionally implemented using a phase locked loop circuit or a delayed locked loop circuit. The host controller 220 of FIG. 1 includes an input circuit 230, an output circuit 240, and a host input/output (I/O) block 250.

The processing circuit 211 may be hardware and/or software that controls the generation of a command CMD, the interpretation of a response, the processing of data stored in an extended card specific data (EXT_CSD) register 380 of the eMMC 300, and/or the processing of read/write data. The processing circuit 211 may be used to control the operation of the clock generator 210 and host controller 220.

The processing circuit 211 may be used to communicate a "tuning command" that is newly defined within the context of the inventive concept. Based on a response of the eMMC device 300 to the tuning command, tuning block data signals (e.g., a tuning block pattern) may be transmitted to the eMMC device 300.

The eMMC device 300 may perform a tuning operation that identifies an optimum valid window for data signals using the clock CLK based on the tuning command and the tuning block data signals received from the host 200. In other words, the tuning operation performed by the eMMC device 300 and host 200 may be used to generate information regarding the valid window received from the eMMC device 300, and such information may be used to adjust (e.g.,) the phase of the clock CLK. Hence, the tuning operation contemplated by embodiments of the inventive concept may be used to reduce a data error rate during high-speed modes of operation. In this regard, the tuning operation may be performed using a low-speed mode to ensure accuracy of the tuning operation. Then, following the tuning operation, read/write operations may be performed using a high-speed mode.

During a read operation, the input circuit 230 receives "read data" via the host I/O block 250 that has been retrieved by the eMMC 300 from constituent flash memory 370, for example. In this regard, the input circuit 230 may initially receive start bit option information or valid window information that is stored in an extended card specific device (EX_CSD) register 380 of the eMMC 300 via the host I/O block 250. Using the output circuit 240 and host I/O block 250, the host 200 may communicate commands (CMD) in accordance with the start bit option information or the valid window information.

During a write operation and in response to the clock CLK, the output circuit 240 may be used to communicate "write data" to be written to the flash memory 370 in the eMMC 300 via the host I/O block 250.

In the eMMC system 100 of FIG. 1, it is assumed that an eMMC bus 99 includes the ten (10) lines indicated by corresponding JEDEC standards. These ten lines include a unidirectional clock line 101 used to communicate the clock CLK, a bidirectional command/response line 102 used to communicate commands from the host 200 to the eMMC 300 and to communicate responses from the eMMC 300 to the host 200, and a bidirectional data bus 103 including eight (8) data lines DAT[7:0] used to communicate data signals.

In addition, the host 200 is assumed to generate and communicate certain I/O operating voltages VCCQ and VSSQ used by the input circuit 230 and the output circuit 240, as well as the I/O operating voltages VCCQ and VSSQ to the eMMC 300. These power signals are communicated via separate power lines. For example, the host 200 may generates core operating voltages VCC and VSS used by the flash memory 370. In certain embodiments of the inventive concept, the voltages VSSQ and VSS may be ground voltages.

The eMMC 300 generally comprises an eMMC controller 310 and flash memory 370. The eMMC controller 310 may be used to control the exchange of data between the host 200 and flash memory 370. In FIG. 1, the eMMC controller 310 includes eMMC I/O block 320, a control logic block 330, and a flash I/O block 340. When the flash memory 370 is implemented by NAND flash memory, the flash I/O block 340 may be implemented by a NAND flash I/O block. In certain embodiments of the inventive concept, the eMMC I/O block 320 will include a valid data detection circuit 400 described hereafter.

During a write operation, write data received via the eMMC I/O block 320 may be temporarily stored in a buffer memory 350 under the control of a central processing unit (CPU) 335. Thereafter, the flash I/O block 340 may retrieve the write data from the buffer memory 350, and program the write data to the flash memory 370 under the control of the CPU 335.

During a read operation, the flash I/O block 340 may be used to move read data retrieved from the flash memory 370 in the buffer memory 350 under the control of the CPU 335. In one particular example, the flash I/O block 340 may be used to move the start bit option information or valid window information provided from the EXT_CSD register 380 to the buffer memory 350 under the control of the CPU 335.

Hence, the buffer memory 350 may be used to temporarily store read data and write data exchanged between the eMMC I/O block 320 and the flash I/O block 340. The memory 350 may be implemented as a volatile memory (e.g., DRAM or SRAM).

In the illustrated example of FIG. 1, the flash memory 370 is assumed to include the EXT_CSD register 380. The EXT_CSD register 380 may be implemented using non-volatile memory. "eMMC information" characterizing the operational capabilities and possible operating modes for the eMMC device 300 may be written to the EXT_CSD register 380. For example, the eMMC information stored in the EXT_CSD register 380 may include clock information (e.g.,) start bit option information or valid window information for the eMMC 300. The start bit option information may be stored in a start bit option field of the EXT_CSD register 380 and the valid window information may be stored in a device tuning clock field of the EXT_CSD register 380.

Figure 2:
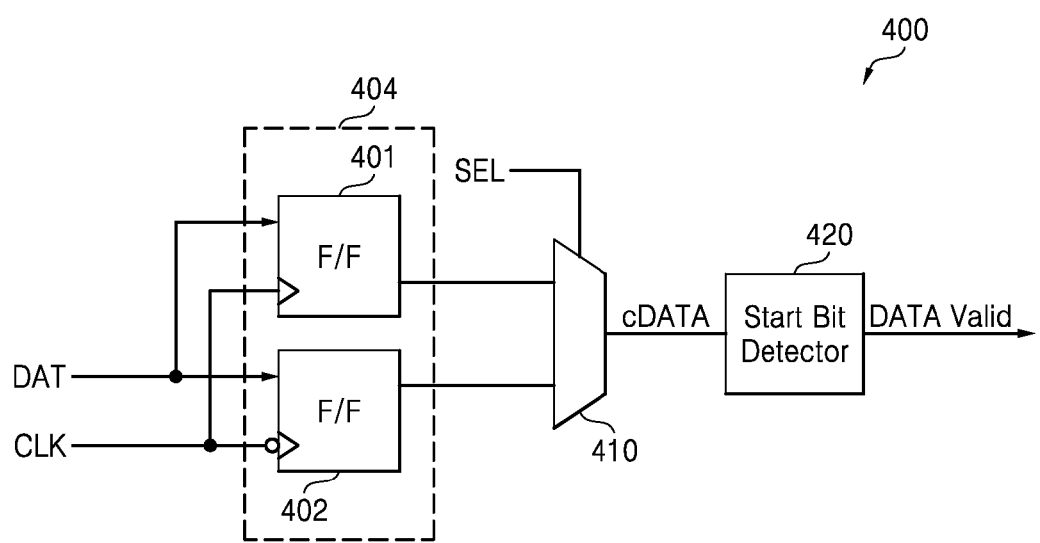
FIG. 2 is a block diagram further illustrating the valid data detection circuit of FIG. 1.

FIG. 2 is a block diagram further illustrating in one embodiments the valid data detection circuit 400 of FIG. 1 according to embodiments of the inventive concept. The valid data detection circuit 400 includes a latch circuit 404 and a start bit detector 420.

The latch circuit 404 receives and latches a data signal received from the host 200 in response to either a first edge (e.g., a falling edge) or a second edge (e.g., a rising edge) of the clock CLK. The latch circuit 404 may be implemented using one or more flip-flop(s) or similar latch circuit(s).

Figure 4:
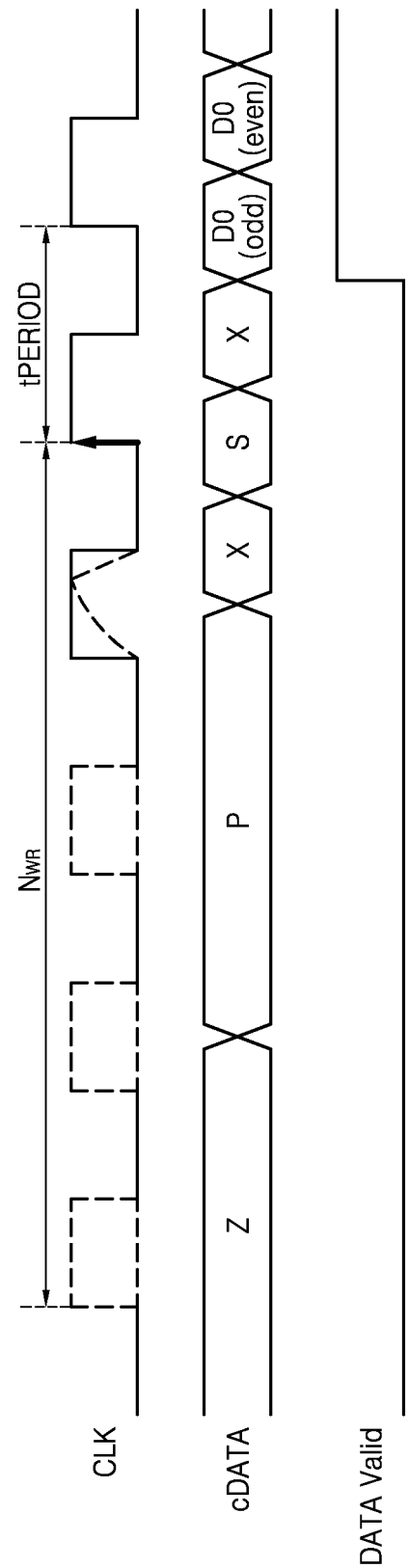

The latch circuit 404 of FIG. 4 includes a first latch circuit 401 that latches a data signal at each first edge (e.g., falling edge) of the clock CLK and a second latch circuit 402 that latches the data signal at each second edge (e.g., rising edge) of the clock CLK. The eMMC device 300 may enable either the first or second latch circuits 401 and 402 according to the channel characteristic existing between the host 200 and the eMMC device 300 so that a data signal is output to the start bit detector 420.

For instance, when the first latch circuit 401 is enabled, a falling edge in a first cycle of the clock CLK is defined as a first edge and a predetermined unit (e.g., a bit) of a data signal is caught and output at the falling edge. When the second latch circuit 402 is enabled, the first cycle of the clock CLK is passed as a dummy cycle and a rising edge in a second cycle of the clock CLK is defined as a second edge and a predetermined unit (e.g., a bit) of a data signal is caught and output at the rising edge.

The valid data detection circuit 400 also includes a selector 410. The selector 410 may be used to output one of the data signals respectively latched by the first and second latch circuits 401 and 402 as a latched data signal (cDATA) according to a selection signal SEL. During write operations, the eMMC device 300 may detect a data signal at either of the first and second edges of the clock CLK during a high-speed mode according to the selection signal SEL, or may detect the data signal when the clock CLK is enabled in a low-speed mode.

The selection signal SEL may be generated based on information stored in the EXT_CSD register 380. That is, the eMMC device 300 may assess the channel characteristics currently existing between the host 200 and eMMC 300. For instance, the eMMC 300 may compares the clock CLK provided by the host 200 with an internally generated clock ("internal clock") in order to determine whether transmission distortion exists. Upon assessing transmission distortion when present, the eMMC may then update a portion (i.e., a designated data field) of the eMMC information stored in the EXT_CSD register 380. In response to a particular command, the eMMC 300 may communicate the eMMC information to the host 200 in the form of EXT_CSD data. In this manner, the eMMC 300 may properly generate the selection signal SEL in view of actual channel conditions.

Returning to FIG. 4, the start bit detector 420 may be used to detect a start bit in the latched data signal (cDATA). When the start bit is detected, the start bit detector 420 outputs the data signal following the start bit as valid data (DATA Valid). Upon receiving the valid data, the host controller 220 may properly recognize data frames received via the data channel and thereafter faithfully communicate data between the eMMC 300 and host 200.

Figure 3:
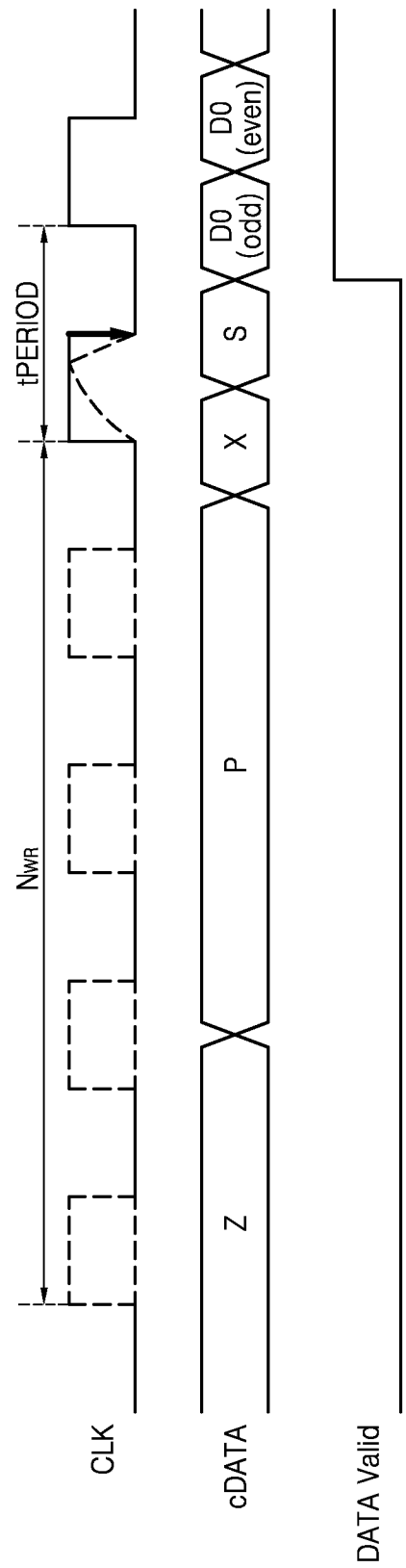
FIGS. 3 and 4 are respective timing diagrams illustrating methods of operating an eMMC device according to embodiments of the inventive concept.

FIG. 3 is a timing chart further illustrating a method of operating the eMMC system 100 of FIG. 1 according to embodiments of the inventive concept. Referring to FIGS. 1 and 3, when the host 200 receives a response from the eMMC 300, the host 200 sends the clock CLK and the data signal DAT[7:0] to the eMMC 300. In FIG. 3, a reference character $N_{WR}$ denotes a period while the clock CLK toggles from a time when the host 200 receives the response to a time when a start bit is detected in the data signal DAT[7:0]; and a reference character (tPERIOD) denotes a period from the time when the start bit is detected to a time when a first data frame (e.g., D0(odd)) is output.

The assessment of channel characteristics is performed in the eMMC system 100. The assessment of channel characteristics may be performed by observing a first clock signal (e.g., clock CLK) output from an interface of the host 200 and a second clock signal (e.g., an internal clock) output from an interface of the eMMC 300 using an oscilloscope and estimating distortion in the second clock signal relative to the first clock signal. According to the result of the assessment, the eMMC 300 may determine whether to latch data signal(s) while the clock CLK is enabled or at an edge of the clock CLK when the eMMC 300 operates in a high-speed mode.

The eMMC 300 may then write the assessment results to a start bit option field in the eMMC information stored in the EXT_CSD register 380. When it is difficult to latch a data signal due to significant impairment (or distortion) in the clock CLK during a high-speed mode, the eMMC 300 may consider the start bit option field in the eMMC information and adjust setting(s) to allow the start bit to be detected at a falling edge of the clock CLK. That is, when a start bit (S) is detected in the latched data signal (cDATA) that has been latched according to current setting(s), the eMMC 300 is able to recognize the latched data signal (cDATA) in relation to a first data frame (D0(odd)) following the start bit S as the valid data (DATA Valid).

FIG. 4 is another timing chart further illustrating a method of operating the eMMC system 100 of FIG. 1 according to embodiments of the inventive concept. For convenience of description, only differences between the embodiments described in relation to FIG. 3 will be described in relation to FIG. 4.

For example, the eMMC 300 assumed in FIG. 4 establishes control setting that allow the first cycle of the clock CLK to be processed as a dummy clock signal, and the start bit (S) to be detected at a rising edge of the second cycle of the clock CLK based on current eMMC information. When the start bit (S) is detected in the latched data signal (cDATA) as latched according to the current setting(s), the eMMC 300 will ignore a first cycle (X) of the latched data signal (cDATA) following the start bit (S) as dummy data, and recognize the latched data signal (cDATA) from the following cycle (D0) as the valid data (DATA Valid).

Figure 5:
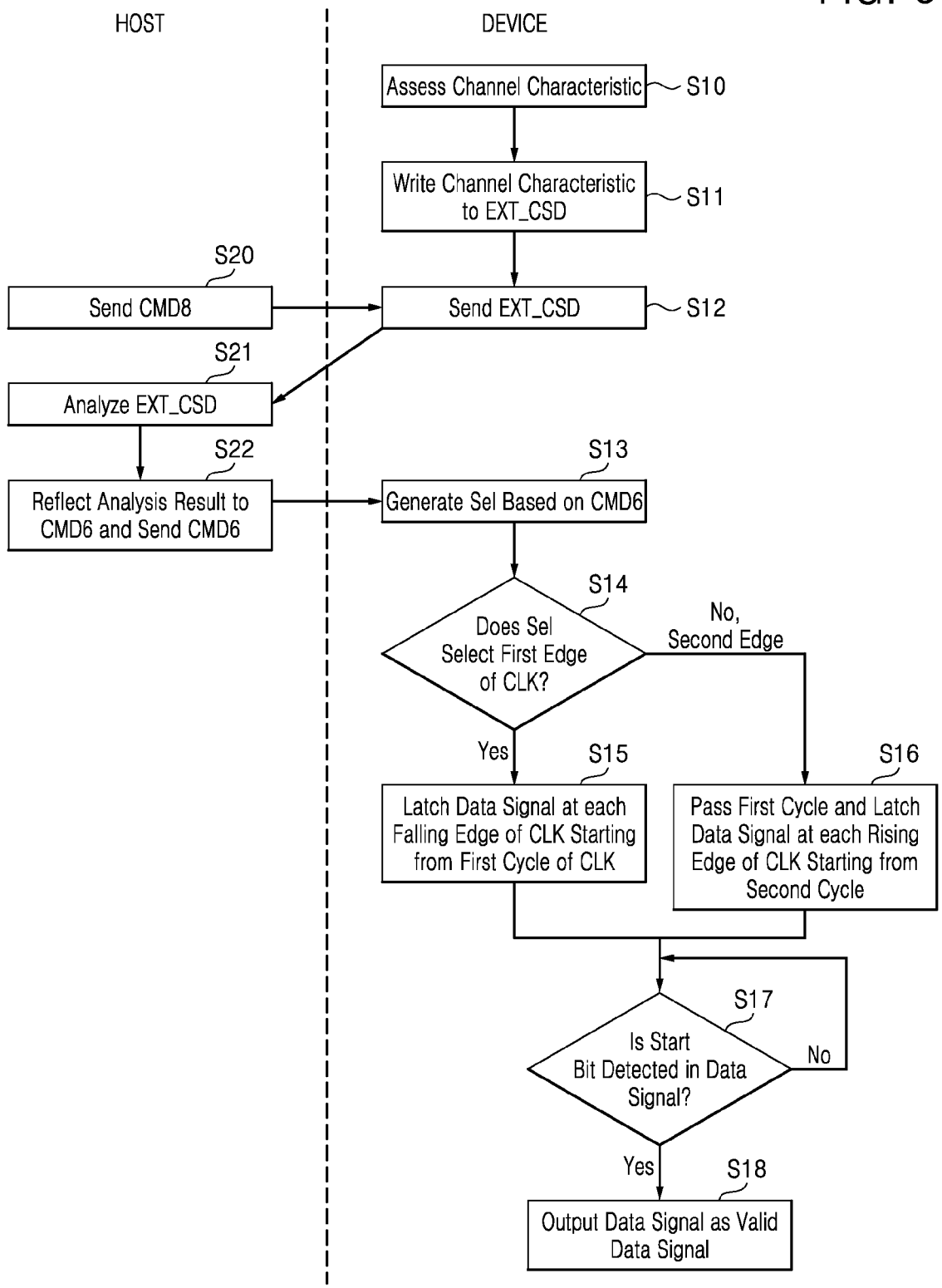
FIG. 5 is a flowchart summarizing a methods of operating an eMMC system according to the embodiments of the inventive concept.

FIG. 5 is a flowchart summarizing certain methods of operating the eMMC system 100 of FIG. 1 according to embodiments of the inventive concept. Referring to FIGS. 1 through 5, the eMMC 300 assesses the channel characteristic between the host 200 and eMMC 300 (S10). The eMMC 300 then writes information to a designated start bit option field for the eMMC information stored in the EXT_CSD register 380 based on the result of the assessment in (S11).

The host 200 sends a SEND_EXT_CSD command (i.e., CMD8) to the eMMC 300 (S20), and the eMMC 300 returns eMMC information (EXT_CSD) to the host 200 in response to CMD8 (S12). The SEND_EXT_CSD command or CMD8 is a control command instructing the eMMC 300 to send data corresponding to the eMMC information that is stored in the EXT_CSD register 380 to the host 200.

The host 200 receives and analyzes the eMMC information (EXT_CSD) (S21). At this time, the host 200 may analyze the start bit option field in the EXT_CSD received from the eMMC 300. The host 200 sends to the eMMC 300 a SWITCH command (i.e., CMD6) for setting the eMMC 300 based on the EXT_CSD (S22), wherein the SWITCH command or CMD6 is a control command to set control parameters of the eMMC 300 according to the assessed channel characteristic.

The eMMC 300 may then generate the selection signal SEL according to the SWITCH command (or CMD6) (S13). The selection signal SEL selects a first edge (e.g., a falling edge) of the clock CLK (S14), the eMMC 300 latches a data signal at each falling edge of the clock CLK starting from the first cycle (S15). When the eMMC 300 detects the start bit (S) in the latched data (cDATA) (S17), the eMMC 300 recognizes the latched data (cDATA) starting from a first data frame following the start bit (S) as the valid data (DATA Valid) (S18).

When the selection signal SEL selects a second edge (e.g., a rising edge) of the clock CLK (S14), the eMMC 300 passes the first cycle of the clock CLK and latches the data signal at each rising edge of the clock CLK starting from the second cycle (S16). When the eMMC 300 detects the start bit (S) in the latched data (cDATA) (S17), the eMMC 300 recognizes the latched data (cDATA) starting from a first data frame following the start bit (S) as the valid data (DATA Valid) (S18). At this time, there may be dummy data (X) between the start bit S and the first data frame.

Figure 6:
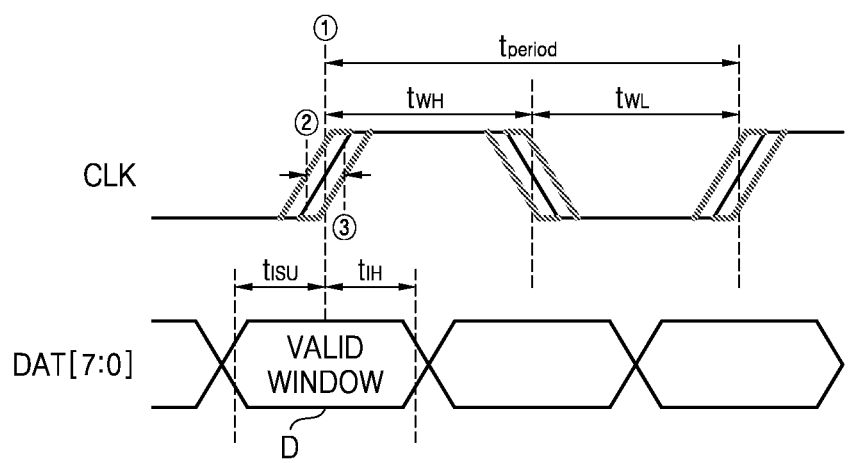
FIG. 6 is a signal timing diagram illustrating a relationship between clock and data signals in an eMMC system defined in accordance with JESD84-B451.

FIG. 6 is a signal timing diagram showing relationships between the clock CLK and a data signal in an eMMC system defined in accordance with JESD84-B451. A time during which the clock CLK is enabled in a period $t_{period}$ is denoted by $t_{WH}$; a time during which the clock CLK is disabled in the period $t_{period}$ is denoted by $t_{WL}$, a setup time during which the clock CLK is set up based on the data signal DAT[7:0] is denoted by $t_{ISU}$; and a hold time during which the clock CLK is held is denoted by $I_{IH}$.

Referring to FIG. 6, during a write operation, the host 200 may align the clock CLK with the center of a data frame D in setting ① and send the data signal DAT[7:0] to the eMMC 300 according to the setting ①. The host 200 sends the data signal DAT[7:0] to the eMMC 300 with the clock CLK aligned with the center of the data frame (D), thereby marginally securing the setup time $t_{ISU}$ and the hold time $t_{IH}$. In other words, even when there is delay (② or ③) in the clock CLK or the data signal DAT[7:0] because of a load component in a clock signal channel or a data channel, the eMMC 300 can recognize the data signal DAT[7:0] that is received within a margin condition defined in JESD84-B451.

However, when the delay (② or ③) caused by the load component in the clock CLK or the data signal DAT[7:0] goes beyond the margin condition defined in JESD84-B451. That is, when the clock CLK is significantly displaced from the center of the data frame (D), a conventionally operating eMMC 300 cannot properly recognize the data signal DAT [7:0]. For this reason, an eMMC 300 operated in accordance with an embodiment of the inventive concept will send to the host 200 certain load component information for the data channel, as obtained by performing a tuning operation. Using this load component information, the host 200 may adjust the alignment between the clock CLK and the data signal DAT [7:0].

In other words, an eMMC 100 according to embodiment of the inventive concept may perform a tuning operation to essentially "tune" constituent clock timing to determine a valid window in consideration of actual load component(s) for the clock channel and data channel. In addition, the eMMC systems operated in accordance with the embodiments of the inventive concept allow the host 200 to consider valid window information during the setting of operating parameters for the eMMC 300, thereby adjusting the phase of the clock CLK provided by the host 200. As a result, the eMMC 300 reduces the loss of the data received from the host 200.

Figure 7:
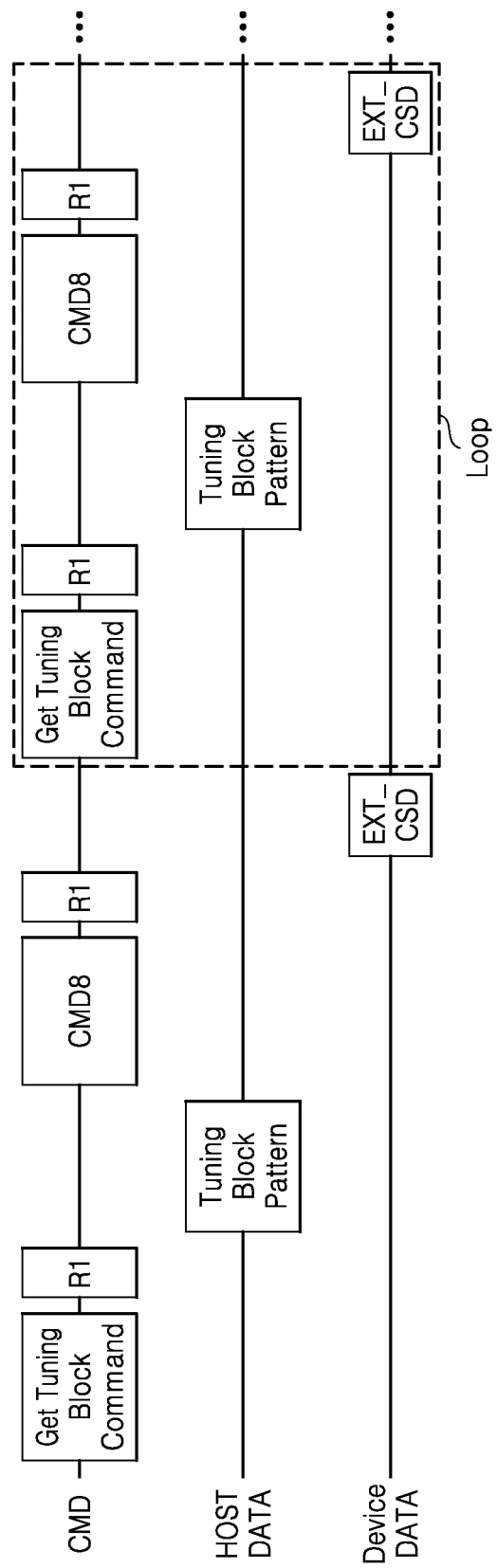
FIG. 7 is an operating diagram illustrating a method of operating an eMMC system according to embodiments of the inventive concept.

FIG. 7 is an operating diagram further illustrating a method of operating the eMMC system 100 of FIG. 1 according to embodiments of the inventive concept. Referring to FIG. 7, during a write operation, the host 200 sends a tuning command or a "Get tuning block" command to the eMMC 300. The eMMC 300 returns a response R1 acknowledging receipt of the command.

Thereafter, the host 200 sends a tuning block data signal or a tuning block pattern to the eMMC 300. The eMMC 300 performs tuning on an input signal using the tuning block data signal. The tuning block data signal may be the same as a tuning block data signal in SEND_TUNING_BLOCK or CMD21. The eMMC 300 writes a channel load component obtained as a result of the tuning operation to a DEVICE_TUN_CLK field in the eMMC information stored in the EXT_CSD register 380.

The host 200 then sends a SEND_EXT_CSD command (or CMD8) to the eMMC 300, and the eMMC 300 returns a response R1 acknowledging receipt of the command and also the data contents of the EXT_CSD register 380 to the host 200.

The host 200 analyzes the DEVICE_TUN_CLK field in the eMMC information, and adjusts the phase of the clock CLK communicated to the eMMC 300 by the host 200. The host 200 and the eMMC 300 may again perform the tuning operation based on the adjusted clock CLK in an iterative (or looping) manner to thereby confirm whether the adjusted clock CLK is appropriately applied to the valid window of a data signal (i.e., optimizing the setting ① illustrated in FIG. 6 to obtain a maximum valid data window).

FIG. 8 is a table listing one possible definition for the tuning command (i.e., the "Get tuning block" command) of FIG. 7. It should be noted that this tuning command is newly defined in addition to the set of commands defined in the JESD84-B451. As shown in FIG. 8, according to the "Get tuning block" command, a 128-clock tuning pattern (64 bytes in 4-bit mode or 128 bytes in 8-bit mode) is sent via a data channel and used to detect an optimal sampling point while the eMMC 300 is operating in DDR400 mode.

FIG. 9 is a table listing one possible DEVICE_TUN_CLK field that may be used in relation eMMC information data stored in the EXT_CSD register 380. The eMMC 300 may write the channel load component obtained as the result of a tuning operation to the DEVICE_TUN_CLK field designated in the EXT_CSD register 380. The DEVICE_TUN_CLK field is newly defined in addition to the fields defined for the data stored in the EXT_CSD register 380 by JESD84-B451.

FIG. 10 is a table listing possible data contents for the EXT_CSD register 380 that may be obtained with respect to the tuning block data signal according to the embodiments of the inventive concept. Here, it is assumed that the host 200 sends the tuning block data signal (i.e., the tuning block pattern) to the eMMC 300. The tuning block data signal may be the same as a tuning block data signal in SEND_TUNING_BLOCK or CMD21. The eMMC 300 may then performs a tuning operation on an input signal using the tuning block data signal, and write results of the tuning operation to the eMMC information stored in the EXT_CSD register 380 and send the eMMC information to the host 200.

Referring to FIG. 10, how much a clock signal is displaced from the center of a data signal may be expressed using a 4-bit mode. For instance, when the eMMC 300 may return 4'b1111 to the host 200 as part of the eMMC information that means that the clock signal is advanced from the center of the data signal by at least 700 ps. The host 200 may then adjust the phase of the clock signal based on this valid window information.

Figure 11:
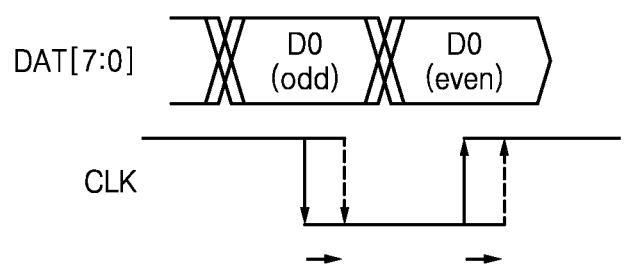
FIGS. 11, 12, 13 and 14 are respective signal timing diagrams that further illustrate the method of FIG. 7.
Figure 12:
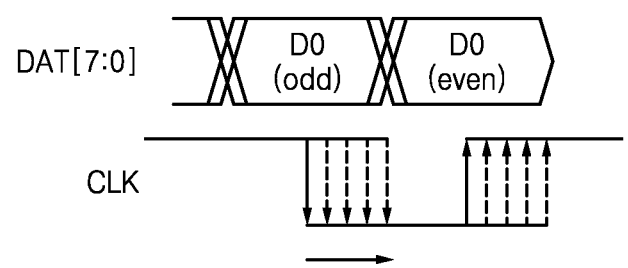
Figure 13:
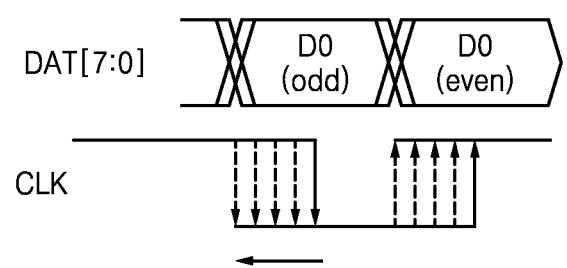

FIGS. 11, 12 and 13 are respective signal diagrams further illustrating in one embodiment the clock CLK adjustment capabilities provided by certain embodiments of the inventive concept.

The eMMC 300 may perform a tuning operation by shifting the phase of a clock CLK with the phase of a data signal DAT[7:0] fixed, as shown in FIG. 11. In other words, when receiving a data frame D0 from the host 200, the eMMC 300 may adjust the phase of the clock CLK based on the data frame D0 using a delay chain for the data signal DAT[7:0] and a delay chain for the clock CLK in order to find a valid window. At this time, a tuning block data signal is used to adjust the delay (or phase) of the data signal DAT[7:0] or the clock CLK.

Referring to FIGS. 11 and 12, the eMMC 300 fixes the phase of the data signal DAT[7:0] and delays the clock CLK so that the phase of the clock CLK is shifted to the right up to a point where the data signal DAT[7:0] is corrupt, thereby finding a range for the valid data window with respect to a given hold time.

Referring to FIGS. 11 and 13, the eMMC 300 fixes the phase of the data signal DAT[7:0] and brings the clock CLK forward so that the phase of the clock CLK is left-shifted up to a point where the data signal DAT[7:0] is corrupt, thereby finding a range for the valid data window with respect to a given setup time. As described above, when the clock CLK is advanced or delayed to a certain degree the data frame D0 will be corrupted and a range defined such that a maximum valid data window is defined for the data frame D0.

Figure 14:
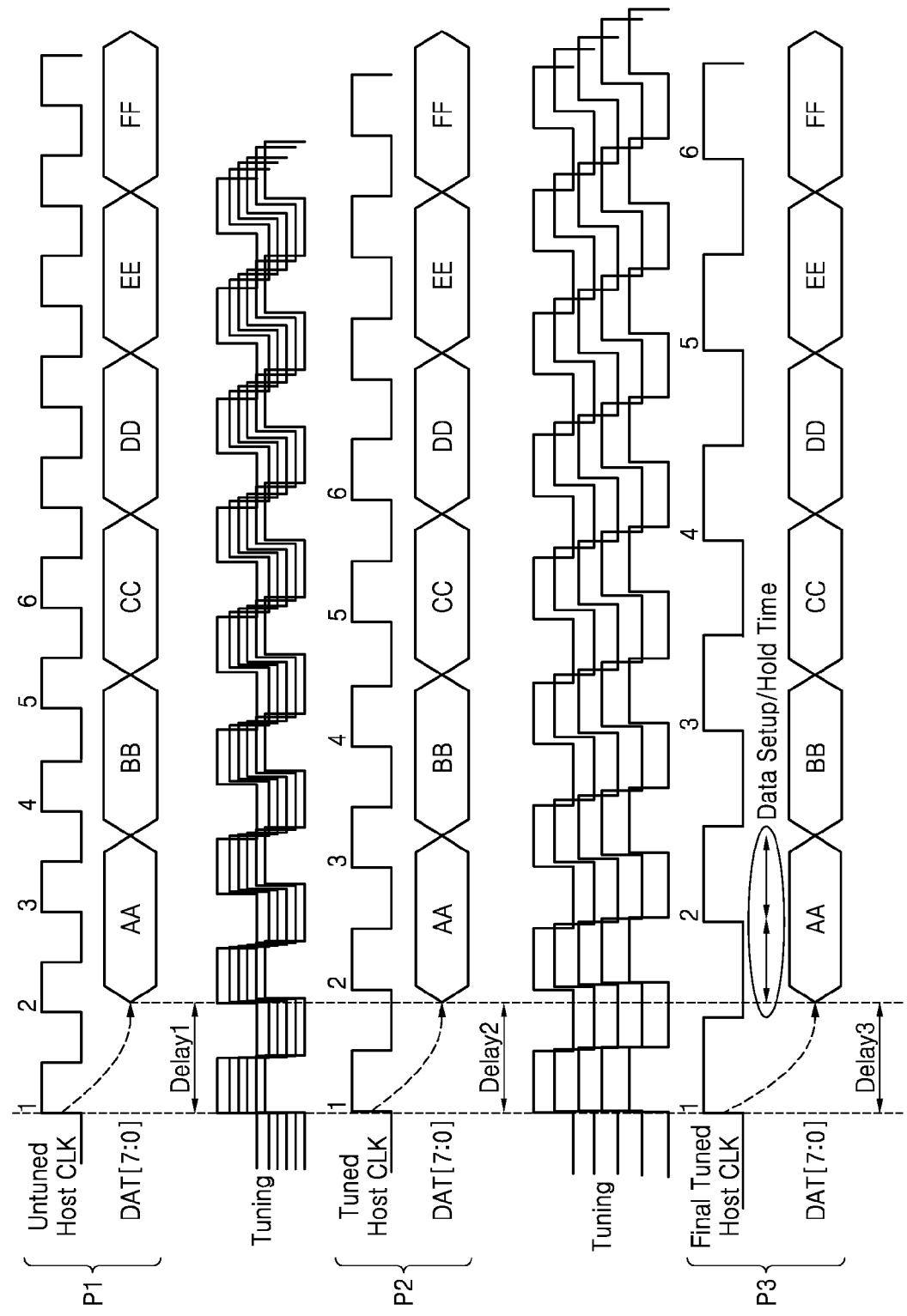

FIG. 14 is a comparative timing chart further illustrating the tuning operation and results described with respect to the foregoing embodiments. Referring to FIG. 14 and case P1, an un-tuned clock CLK is delayed by a predetermined time Delay1 and then is transmitted starting from its second cycle together with the data signal DAT[7:0] (including data frames AA, BB, CC, DD, EE, and FF).

Thereafter, the eMMC 300 fixes the data signal DAT[7:0] and tunes the clock CLK using a tuning block data signal. The phase of the clock CLK, which is used to latch the data signal DAT[7:0], is shifted every time when the clock CLK passes through a delay chain in the eMMC 300 since the delay time Delay1 elapses. As a result, the tuned host clock CLK is within a valid window when it is set with the data signal DAT[7:0] as shown in part P2, and therefore, the eMMC 300 obtains information about the valid window.

With reference to case P2, the eMMC 300 writes the information about the valid window to a DEVICE_TUN_CLK field in EXT_CSD and sends the EXT_CSD to the host 200. The host 200 adjusts the phase of the clock CLK as shown in part P2 and sends the tuned host clock CLK to the eMMC 300.

The eMMC 300 performs the tuning operation shown in the loop in FIG. 7. As a result, the phase of the clock CLK for latching the data signal DAT[7:0] is shifted. Therefore, when the final tuned host clock CLK is set with the data signal DAT[7:0] as shown in case P3, it satisfactorily covers a valid window (i.e., the data setup/hold time).

The eMMC 300 writes information about the valid window shown in part P3 to the DEVICE_TUN_CLK field in the EXT_CSD and sends the EXT_CSD to the host 200. The host 200 adjusts the phase of the clock CLK as shown in part P3 and sends the final tuned host clock CLK to the eMMC 300. As a result, the eMMC 300 is able to establish operating parameters such that the final tuned clock CLK used in high-speed modes results in an reduction of data loss due to a channel load component(s).

Figure 15:
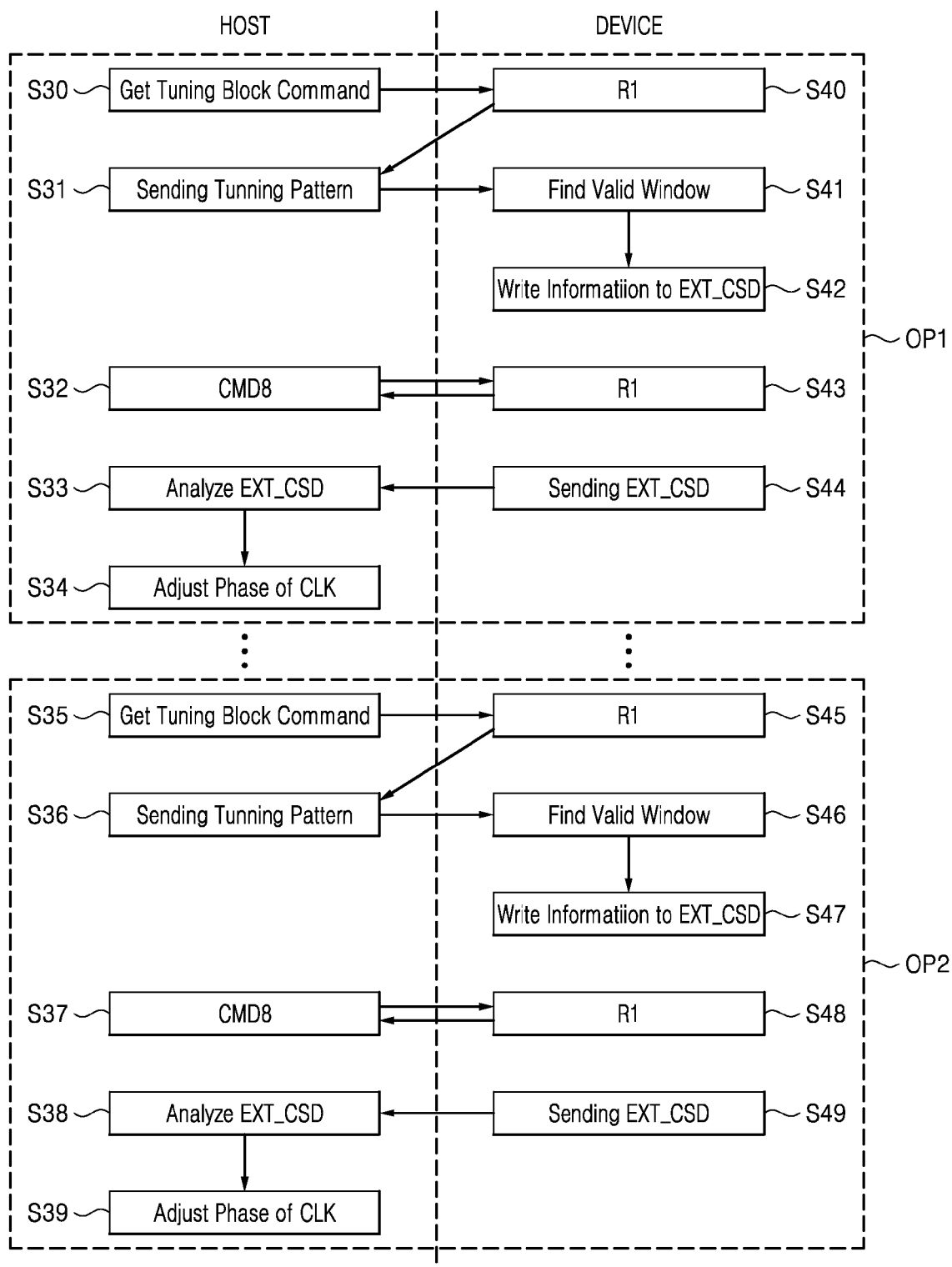
FIG. 15 is an operating diagram illustrating a method of operating an eMMC system consistent with the timing considerations of FIGS. 11, 12, 13 and 14.

FIG. 15 is an operating diagram further illustrating certain methods of operating the eMMC system 100 of FIG. 1 according to embodiments of the inventive concept. During a write operation, the host 200 sends a tuning command (i.e., a get tuning block command) to the eMMC 300 (S30), and the eMMC 300 returns a response R1 acknowledging the receipt of the command (S40).

Thereafter, the host 200 sends a tuning block data signal (i.e., a tuning pattern) to the eMMC 300 (S31). The eMMC 300 performs a tuning operation on an input signal using the tuning pattern, where the tuning block data signal may be the same as a tuning block data signal in CMD21. The eMMC 300 finds a valid window reflecting a channel load component as a result of the tuning operation (S41). The eMMC 300 writes information about the valid window to the DEVICE_TUN_CLK field in the eMMC information stored in the EXT_CSD register 380 (S42).

The host 200 sends a control command, i.e., SEND_EXT_CSD (CMD8) to the eMMC 300 (S32), and the eMMC 300 returns a response R1 acknowledging the receipt of the command in operation S43 and also sends the updated eMMC information stored in the EXT_CSD register 380 to the host 200 (S44).

The host 200 analyzes the eMMC information received from the eMMC 300 (S33), and adjusts the phase of the clock CLK communicated from the host 200 to the eMMC 300 based on the valid window information contained in the eMMC information (S34). In this way, the eMMC 300 is able to perform an iterative tuning operation reflecting the channel load component (i.e., iterations OP1 though OPn of FIG. 15).

Thereafter, the host 200 and eMMC 300 iteratively repeat the tuning operation using a progressively adjusted clock CLK in order to confirm whether the clock CLK is appropriately aligned with a center of a data signal. That is, the host 200 sends the tuning command to the eMMC 300 (S35), and the eMMC 300 returns a response R1 acknowledging the receipt of the command (S45).

The host 200 sends a tuning pattern to the eMMC 300 together with the adjusted clock CLK (S36). The eMMC 300 performs the tuning operation on an input signal using the tuning pattern. The eMMC 300 finds a valid window reflecting a channel load component as a result of the tuning operation (S46). The eMMC 300 writes information about the valid window to the DEVICE_TUN_CLK field of the eMMC information stored in the EXT_CSD register 380 (S47).

Then, the host 200 sends SEND_EXT_CSD (CMD8) to the eMMC 300 (S37), and the eMMC 300 returns a response R1 acknowledging the receipt of the command (S48) and also sends the updated eMMC information stored in the EXT_CSD register 380 (S49). The host 200 analyzes the DEVICE_TUN_CLK field of the updated eMMC information to confirm whether the phase of the clock CLK is properly aligned with the center of the data signal (S38), and adjusts the phase of the clock CLK until the phase of the clock CLK is within the valid window with the defined margin (S39).

FIG. 16 is a table listing possible device type field definitions for an eMMC system capable of operating in the DDR400 mode. Referring to FIGS. 1 and 16, a DEVICE_TYPE[196] field of the EXT_CSD register 380 defines a type of the eMMC 300. While only bits 0 through 5 of the DEVICE_TYPE[196] field are defined in the JESD84-B451, information indicating whether the eMMC 300 supports the DDR400 mode is stored in the DEVICE_TYPE[196] field according to the current embodiments.

For instance, information about whether a 200 MHz DDR mode is supported at a voltage of 1.8 V (i.e., VCCQ=1.8 V) is stored in bit 6 and information about whether a 200 MHz DDR mode is supported at a voltage of 1.2 V (i.e., VCCQ=1.2 V) is stored in bit 7.

The DEVICE_TYPE[196] field of the EXT_CSD register 380 is transmitted from the eMMC 300 to the host 200 according to SEND_EXT_CSD (=CMD8) output from the hosts 200. Accordingly, the host 200 can determine whether the eMMC 300 supports the DDR400 mode based on bit 6 or 7 stored in the DEVICE_TYPE[196] field of the EXT_CSD register 380.

FIG. 17, inclusive of FIGS. 17A and 17B, shows HS_TIMING and HS_TIMING values for an eMMC system capable of operating in the DDR400 mode. An HS_TIMING[185] field of the EXT_CSD register 380 is used by the host 200 to select a timing interface and a driver strength. In the current embodiments of the inventive concept, "0x3" is added to the HS_TIMING[185] field.

When the host 200 sets the HS_TIMING[185] field to "1", the eMMC 300 changes to high speed interface timing. When the host 200 sets the HS_TIMING[185] field to "2", the eMMC 300 changes to HS200 interface timing.

When the host 200 sets the HS_TIMING[185] field to "3", the eMMC 300 changes to DDR400 interface timing. Embodiments of the DDR400 interface timing are illustrated in FIGS. 12 and 13. In other words, the host 200 issues the SWITCH command (CMD6) to set a DDR400 bit and a driver strength value in the HS_TIMING[185] field of the EXT_CSD register 380.

Figure 18:
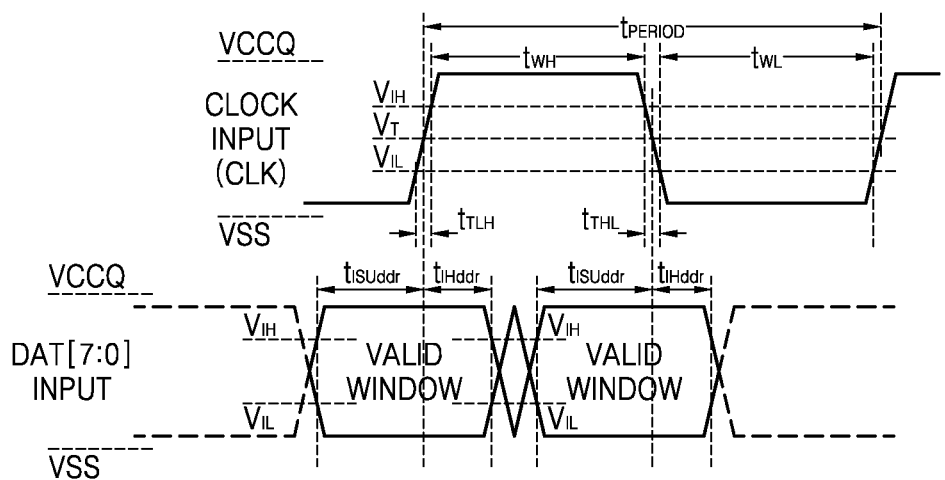
FIG. 18 is a timing diagram illustrating input signals for an eMMC capable of operating in DDR400 mode.

FIG. 18 is a signal timing diagram illustrating input signals to an eMMC system capable of operating in the DDR400 mode, and FIG. 19 is a table listing operating parameters associated with the signal timing diagram of FIG. 18.

Referring to FIGS. 1, 18 and 19, when the timing of the tuned clock CLK and a delay-adjusted data signal DAT[7:0] (=DAT[7:0] INPUT) satisfies the conditions illustrated in FIGS. 18 and 19, skew between the delay-adjusted clock CLK (=CLOCK INPUT) and the delay-adjusted data signal DAT[7:0] (=DAT[7:0] INPUT) is reduced. Therefore, a data valid window is secured. Accordingly, the an eMMC system operating in this manner may increase data transfer performance.

As described above, according to certain embodiments of the inventive concept, data latched using an edge of a clock signal generated during a high-speed mode of operation for an eMMC system prevents data loss due to distortion in a constituent clock signal. In addition, a host in the eMMC system may be used to adjust the phase of the clock signal based on valid window information from the eMMC device so that data loss due to a channel load component is reduced.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. An embedded multimedia card (eMMC) communicating with a host, the eMMC comprising:
   a latch circuit configured to receive and latch a data signal according to one of a first edge and a second edge of a clock to generate a latched data signal; and
   a start bit detector configured to detect a start bit in the latched data signal, and provide, in response to detecting the start bit, a valid data signal from a portion of the latched data signal following the start bit.

2. The eMMC of claim 1, wherein the latch circuit comprises:
   a first latch circuit that latches the data signal at the first edge, and a second latch circuit that latches the data signal at the second edge, wherein the eMMC enables one of the first and second latch circuits, in response to a channel characteristic for a channel between the host and the eMMC, to thereby provide the latched data signal to the start bit detector.

3. The eMMC of claim 2, wherein when the first latch circuit is enabled, the eMMC recognizes a falling edge of the clock starting from a first cycle of the clock as the first edge and provides the latched data signal to the start bit detector.

4. The eMMC of claim 2, wherein when the second latch circuit is enabled, the eMMC passes a first cycle of the clock as a dummy cycle, then recognizes a rising edge of the clock starting from a second cycle of the clock as the second edge and provides the latched data signal to the start bit detector.

5. The eMMC of claim 2, wherein the eMMC is configured to compare a first clock signal provided by the host with a second clock signal apparent at the eMMC to determine the channel characteristic.

6. The eMMC of claim 5, wherein the eMMC is further configured to define a start bit option field in an extended card specific data (EXT_CSD) register based on the channel characteristic.

7. The eMMC of claim 6, wherein the eMMC is further configured to selectively enable one of the first and second latch circuits according to a SWITCH command provided by the host, wherein the SWITCH command is defined according to data stored in the start bit option field of the EXT_CSD register.

8. The eMMC of claim 1, wherein the eMMC is configured to selectively operate in a high-speed mode and during the high-speed mode the eMMC recognizes the data signal in response to one of the first and second edges of the clock.

9. A method of operating an embedded multimedia card (eMMC) system including an eMMC having an extended card specific data (EXT_CSD) register and a host, the method comprising:
   determining a channel characteristic for a clock channel communicating a clock from the host to the eMMC;
   modifying eMMC information stored in the EXT_CSD register in accordance with the channel characteristic;
   communicating a SWITCH command from the host to the eMMC defined in accordance with the modified eMMC information;
   generating a selection signal in the eMMC in response to the SWITCH command;
   latching a data signal received from the host at one of a first edge and a second edge of the clock to generate a latched data signal;
   providing the latched data signal to a start bit detector in response to the selection signal; and
   detecting, with the start bit detector, a start bit in the latched data signal.

10. The method of claim 9, further comprising:
    providing a valid data signal derived from the latched data signal starting from a first data frame following the start bit.

11. The method of claim 10, wherein latching the data signal comprises recognizing a falling edge of the clock starting from a first cycle of the clock as the first edge and latching the data signal at the first edge.

12. The method of claim 10, wherein latching the data signal comprises passing a first cycle of the clock as a dummy cycle, then recognizing a rising edge of the clock starting from a second cycle of the clock as the second edge.

13. The method of claim 10, wherein the data signal comprises at least one dummy data frame between the start bit and the first data frame.

14. The method of claim 10, wherein determining the channel characteristic comprises comparing a first clock signal provided by the host with a second clock signal apparent at the eMMC.

15. The method of claim 14, wherein data identifying the channel characteristic is written to a start bit option field designated in the eMMC information stored in the EXT_CSD register.

16. The method of claim 10, wherein the selection signal enables latching of the data signal in response to one of the first and second edges of the clock during a high-speed mode of operation for the eMMC.

17. The method of claim 10, wherein the valid data signal is provided in response to detecting the start bit.

* * * * *